United States Patent
De Cremoux

(10) Patent No.: US 8,125,209 B2
(45) Date of Patent: Feb. 28, 2012

(54) REFERENCE VOLTAGE CIRCUIT

(75) Inventor: Guillaume De Cremoux, Edinburgh (GB)

(73) Assignee: ST-Ericsson SA, Geneva (CH)

( * ) Notice: Subject to any disclaimer, the term of this patent is extended or adjusted under 35 U.S.C. 154(b) by 651 days.

(21) Appl. No.: 11/719,743

(22) PCT Filed: Nov. 11, 2005

(86) PCT No.: PCT/IB2005/053723
§ 371 (c)(1),
(2), (4) Date: Sep. 4, 2009

(87) PCT Pub. No.: WO2006/054217
PCT Pub. Date: May 26, 2006

(65) Prior Publication Data
US 2009/0322305 A1    Dec. 31, 2009

(30) Foreign Application Priority Data

Nov. 18, 2004  (EP) ................................. 04105871

(51) Int. Cl.
*H03H 1/00*    (2006.01)
(52) U.S. Cl. ........................ 323/370; 327/538
(58) Field of Classification Search .............. 327/538; 323/326, 370, 304, 352
See application file for complete search history.

(56) References Cited

U.S. PATENT DOCUMENTS

| 5,406,636 | A  | * | 4/1995  | Yamada et al. | ............. 381/106 |
| 6,278,634 | B1 |   | 8/2001  | Ra            |                       |
| 7,463,231 | B2 | * | 12/2008 | Miura         | ............. 345/89  |
| 2004/0160823 | A1 |   | 8/2004 | Owen          |                       |

OTHER PUBLICATIONS

"Precision Voltage Reference Using Eeprom and Floating Gate Trim", McCreary et al.
International Search Report dated Aug. 2, 2006 in connection with PCT Patent Application No. PCT/IB2005/053723.
Written Opinion of the International Searching Authority dated May 18, 2007 in connection with PCT Patent Application No. PCT/IB2005/053723.

* cited by examiner

*Primary Examiner* — Shawn Riley

(57) ABSTRACT

The present invention provides a reference voltage circuit making use of a non-volatile and non-modifiable storage of an electric charge. A tunable transformation module is adapted to transform a constant voltage corresponding to the constant stored charge into an output reference voltage. Further, a control loop provides tuning of the transformation module by means of an external calibration module with respect to a high precision reference voltage source. During a calibration procedure the transformation module is tuned in such a way that the output reference voltage equals the high precision reference voltage. After disconnecting reference voltage electronic circuit and calibration module, the output reference voltage is governed by the charge stored by means of the non-volatile storage and by the configuration of the tunable transformation module. It remains constant and accurate with respect to time and temperature and consumes only a minimum of electric current.

9 Claims, 3 Drawing Sheets

REFERENCE VOLTAGE CIRCUIT

CROSS-REFERENCE TO RELATED APPLICATION(S)

Figure 1:
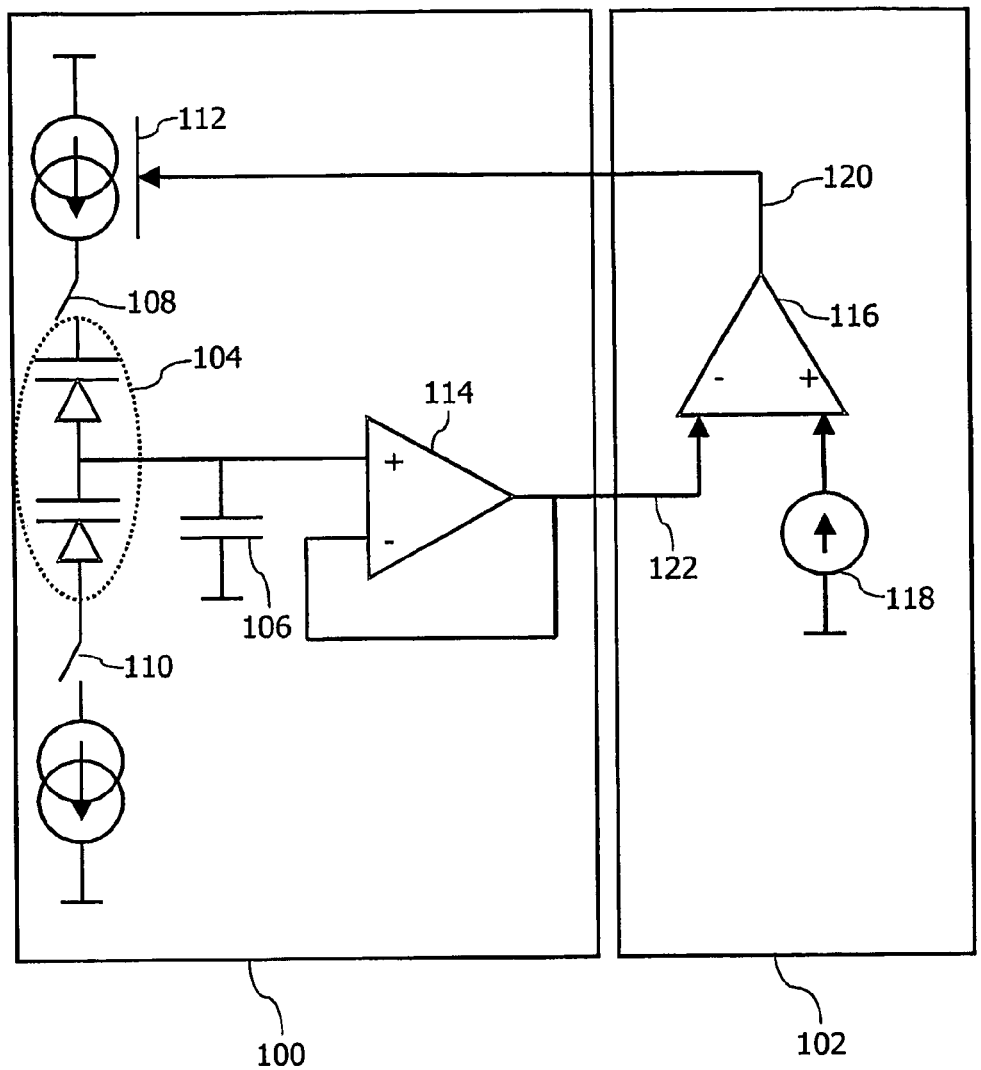

The present application claims priority under 35 U.S.C. §365 to International Patent Application No. PCT/IB2005/053723 filed Nov. 11, 2005, entitled "REFERENCE VOLTAGE CIRCUIT". International Patent Application No. PCT/M2005/053723 claims priority under 35 U.S.C. §365 and/or 35 U.S.C. §119(a) to European Patent Application No. 04105871.0 filed Nov. 18, 2004 and which are incorporated herein by reference into the present disclosure as if fully set forth herein.

The present invention relates to integrated circuits and in particular to integrated circuits providing a stable and accurate reference voltage.

Precision voltage references are widely used to provide an accurate absolute voltage value that is needed for e.g. calibrating, tuning and operating of a multiplicity of electronic devices. Voltage references have for instance been implemented by making use of the band gap voltage technique, where a diode and a resistor with opposite temperature coefficients are coupled in such a way that the total output voltage of the device almost remains constant with a varying temperature. Making use of the band gap voltage technique, basically a precision of 1% without trimming of the resistances and a precision of 0.1% with trimming of the resistances can be reached. Also, by making use of e.g. double curvature techniques, even a precision of 0.02% of the output reference voltage can be obtained at the expense of a much more complex technical implementation resulting in a non-negligible current consumption. For example, the MAX6126A-SOIC of MAXIM Integrated Products, Inc. Sunnyvale, Calif., USA (for further details refer to http://www.maxim-ic.com) represents a reference voltage making use of the band gap technique and features a precision of 0.02%, a temperature drift of 3 pp/degree and a standby current of about 550 µA.

Other reference voltage devices may make use of junction gate field-effect transistors (JFET) replacing bipolar components of the reference voltage circuit. For example, the ADR433 reference voltage of Analog Devices Inc. (see also http://www.analog.com) provides an absolute accuracy of 0.03%, 10 ppm/degree temperature drift and requires a standby current of 800 µA.

Another well known technique is based on the so called buried Zener diode and may reach comparable performance values by using a regulated voltage that is present at a Zener diode. For instance, the ADR588 voltage reference of Analog Devices Inc. reaches an even better precision and a lower temperature drift at the expense of a rather large standby current of 10 mA.

In particular these large standby currents impose appreciable restrictions when reference voltage circuits have to be implemented in battery powered portable electronic devices, such as e.g. cellular phones. Hence a battery powered portable device must not consume a large standby current even in standby mode. In standby mode, battery powered portable electronic devices may consume up to 200 µA as a required standby current. Since also in standby mode a reference voltage is needed for sensing different electrical values within the portable electronic device, implementing the reference voltage circuit by means of the band gap technique or buried Zener diode technique would additionally require at least 500 µA, thus reducing the total standby time of a battery powered portable electronic device by a factor of 2 to 10.

In order to reduce the current consumption of a voltage reference Xicor Inc. (see also htttt://www.xicor.com) has developed reference voltages X60008B-41, X60008C-41 and X60008D-41. These reference voltages make use of regulating a charge contained in the floating gate of an erasable programmable read-only memory (EEPROM) during a calibration procedure. Such a reference voltage device is schematically illustrated in FIG. 1.

The reference voltage circuit 100 is coupled to a calibration unit 102. The reference voltage circuit 100 comprises an EEPROM module 104, a reference amplifier 114, an adjustable current source 112 as well as a tunneling up switch 108 and a tunneling down switch 110. The calibration unit 102 has a comparator 116 as well as a high precision voltage source 118.

The EEPROM module 104 has a floating gate and provides non-volatile storage of a charge substantially without loss for between 10 to 100 years. Hence, the charge trapping functionality of the EEPROM module 104 is also illustrated by the equivalent capacitor 106. The reference amplifier 114 serves to directly transform the charge stored by the floating gate of the EEPROM module 104 into a reference voltage output at the output port 122 of the reference voltage circuit 100. The reference amplifier 114 therefore acts as a buffer whose output corresponds to the reference output voltage.

During a calibration procedure the reference voltage circuit 100 is coupled to the calibration module 102 and the comparator 116 acts as a feedback amplifier. It compares the output of the buffer 114 with the voltage obtained from the high accuracy voltage source 118 and generates a control signal as output that is indicative of a deviation between the reference voltage and the high precision voltage signal. If the reference voltage is too low, the switch 108 is activated and a current controlled high voltage is applied to the EEPROM module 104 leading to an accumulation of more charges in the EEPROM capacitor through the tunneling effect. In the opposite case, if the reference voltage is too high, the other switch 110 acts in a similar way with the reverse polarity.

In this way, the charge trapped in the EEPROM module 104 is modified until the output of the buffer 114 matches the value of the high precision voltage source 118. Then, the reference voltage circuit 100 and the calibration module 102 are disconnected while the reference voltage output 122 of the reference voltage circuit 100 remains available at a very high precision and with a good stability in time. For instance, the absolute accuracy may be as good as 0.02% with a temperature drift of 3 ppm/degree. Also, the current required by the reference voltage circuit might be below 1 µA, thus fulfilling power consumption restrictions for most portable battery powered electronic devices. For further information also refer to "Precision voltage reference using EEPROM and floating gate trim" by McCreary et al. available at http://www.eetimes.com/article/showArticle.jhtml?articleID=12802489.

Even though the reference voltage illustrated in FIG. 1 principally fulfills requirements of a reference voltage for applications in battery powered portable devices, it is implemented by making use of an EEPROM module that must be particularly adapted for analog voltage values. For implementing an EEPROM module in a reference voltage circuit, the general behavior of the EEPROM must be accurately and properly classified in order to be able to predict how the EEPROM module acts during the calibration procedure. Such a classification of the EEPROM module requires for a large amount of test chips and test circuits and a corresponding extensive and elaborate development and testing procedure.

Additionally, the electrically controlled modification of charges trapped in the EEPROM module is only required during the calibration procedure. Once the calibration has been performed, the EEPROM module only has to trap a distinct electrical charge. Generally, non-volatile storage of a distinct electrical charge by means of an EEPROM module is rather cost intensive as non-volatile storage can also be provided with other low cost electrical components.

The present invention provides a reference voltage electronic circuit that comprises a capacitive element that has a floating gate for non-volatile and non-modifiable storage of a constant charge. The reference voltage electronic circuit further has a tunable transformation module that has an input that is coupled to the capacitor. This input is provided with a constant voltage that corresponds to the constant charge stored by the capacitor. The transformation module then provides tunable transformation of this constant voltage to output reference voltage. Further, the reference voltage electronic circuit comprises a control loop for tuning the transformation module by means of an external calibration module that makes use of a high precision reference voltage source.

In contrast to implementations of the prior art, the invention provides a non-modifiable storage of an arbitrary electrical charge by means of a capacitor or an equivalent read-only memory (ROM) device. Then, during the calibration procedure which is performed in combination with the external calibration module, the transformation properties of the tunable transformation module are appropriately modified in order to obtain the required output reference voltage. Instead of modifying the charge stored in the capacitor, here, the gain or transformation properties of the tunable transformation module are modified. This allows to implement the charge trapping capacitive element as a non-erasable storage device.

Preferably, tuning of the tunable transformation module is performed in an analog way. Hence, classification and modeling of a digital storage device, such as a digital read-only memory (ROM) module is no longer required. The charge trapped by the ROM remains constant during the calibration process and adjusting of the output reference voltage can be realized by an analog tuning of the transformation module.

The calibration module typically compares the output reference voltage of the transformation module with a high precision reference voltage obtained from a high precision reference voltage source and generates a control signal indicating whether the output reference voltage is too high or too low compared to the high precision reference voltage. Based on this control signal, amplification and/or transformation properties of the tunable transformation module are changed in order to minimize the difference between output reference voltage and high precision reference voltage. Once the calibration procedure has been terminated, i.e. the reference voltage substantially equals the high precision voltage, the external calibration module and the reference voltage electronic circuit are disconnected and the reference voltage electronic circuit provides a constant and precise output reference voltage with a low temperature drift and low current consumption, e.g. even below 1 µA.

According to a preferred embodiment, the tunable transformation module of the reference voltage electronic circuit comprises an operational amplifier and at least a first and a second tunable resistor that form a feedback loop. This feedback loop is typically implemented by connecting the output of the operational amplifier to its inverted input The output voltage is scaled by means of the two resistors. In this configuration, the operational amplifier tends to output a voltage in order to make the input voltages equal. Typically, the gain factor of the operational amplifier configuration is proportional to 1 plus the ratio of the two resistors. Hence, by tuning the first and/or second resistor by means of the external calibration module, the gain of the tunable transformation module can be controlled in such a way that the output reference voltage equals the high precision voltage of the calibration module. Consequently, tuning of the first and/or second resistor is effectively controlled by means of the external calibration module.

For instance, the first and/or second resistors may be trimmed by means of a laser method incorporating a mechanical treatment of the thickness and/or the width of the first and/or second resistors. Since after termination of the calibration procedure neither first or second resistors nor charge stored by means of ROM module have to be modified, also the first and/or second resistors can be implemented as a one-time modifiable electrical resistor, such as e.g. a resistor that becomes subject to laser trimming. Other techniques such like fuse blowing also principally allow to realize a non-modifiable trimming of an electrical resistor by selectively blowing e.g. polysilicon fuses.

According to a further preferred embodiment of the invention, the capacitive element of the reference voltage electronic circuit comprises an erasable programmable read-only memory (EPROM) module. The EPROM module allows for non-volatile storage of a distinct electrical charge. Preferably, the EPROM module is subject to a one-shot programming procedure where the EPROM module is temporally coupled to a voltage source. In this way an arbitrary electrical charge is stored by means of the EPROM module that is stable with temperature and with time. Depending on this stored charge, the gain factor of the tunable transformation module is then modified during the calibration procedure. In particular, by implementing a charge trapping device by means of an EPROM module, production costs of the entire reference voltage circuit can be substantially decreased compared to implementations of the prior art making use of EEPROM modules that require calibration of trapped charges and a rather complicated modeling and elaborate classification of the EEPROM module.

In another embodiment, each of the first and/or second resistors of the tunable transformation module comprise a circuit of a set of resistors and a set of metal-oxide-semiconductor (MOS) based switches. Resistance of the first and/or second resistor is then determined by means of the configuration of the set of switches of the corresponding set of resistors. Hence, the circuits of resistors might be realized as a set of resistors that is coupled in series with corresponding switches that are coupled in parallel to each resistor. In this way each resistor of the set of resistors can be switched on and off in order to increase or decrease the total resistance of the first and/or second resistor.

Typically, the first and/or second resistors comprise a large number of unit resistors, each of which having a predetermined variance. It is advantageous to make use of a large number of such unit resistors, since the matching precision between the first and/or second resistor value increases proportional to $1/\sqrt{N}$, where N represents the total number of unit resistors building first and/or second resistors. Generally, the higher the precision of the first and/or second resistors can be trimmed, the higher the accuracy of the reference voltage output can be obtained. Typically, the first and/or second resistors are implemented by switches based on complimentary metal-oxide-semiconductor technology (CMOS) and unit resistors comprising a polysilicon film or that are implemented as diff-used resistors based on a p- or n-diffusion on the substrate. In particular, such a design allows for a compact design and efficient mass production manufacturing of the first and/or second resistors.

According to a further preferred embodiment of the invention, the resistance of the first and/or second resistors are determined by means of the calibration module. Preferably, when implemented as a circuit of a set of resistors of metal-oxide-semiconductor based switches, the switch configuration of the first and/or second resistors is further stored as a set of driving signals that are adapted to drive the gates of the switches of each resistor. These driving signals can be effectively stored by means of an EPROM module. In this way a modulation of the resistance of the first and/or second resistors for tuning of the transformation module and hence for modifying the gain factor of the reference amplifier of the reference voltage electronic circuit can be stored by means of a switch configuration in a digital way. This feature also allows to implement the control loop for tuning the transformation module by a digital control circuit. In response to detect a deviation between output reference voltage and high precision voltage of the calibration module, various switches of the first and/or second resistors can be selectively switched on or off.

In another aspect, the invention provides a method of calibrating a reference voltage electronic circuit that comprises the steps of storing a constant charge by means of a capacitor or read-only memory device that have a floating gate for non-volatile and non-modifiable storage of charges. Having stored the constant charge, a constant voltage that corresponds to the constant charge is provided to an input of a tunable transformation module acting as a reference amplifier. By means of the tunable transformation module, the constant voltage is transformed to an output reference voltage. Further, the reference voltage electronic circuit is calibrated by tuning the transformation module in response to receive a control signal from an external calibration module that makes use of a high precision reference voltage source.

The external calibration module compares the output reference voltage provided by the tunable transformation module with the high precision reference voltage. Deviations between the output reference voltage and the high precision reference voltage lead to a generation of a corresponding control signal that is processed by the tunable transformation module or that is processed by the calibration module itself. In the latter case, the external calibration module is adapted to tune the tunable transformation module in such a way that the output reference voltage corresponds to the high precision reference voltage.

In still another aspect, the invention provides a calibration module for calibrating a reference voltage electronic circuit that has a capacitive element or a read-only memory device with a floating gate for non-volatile and non-modifiable storage of a constant charge. The reference voltage electronic circuit further has a tunable transformation module that has an input that is coupled to the capacitive element or read-only memory and that provides a constant voltage corresponding to the constant charge. The calibration module comprises a high precision reference voltage source and a comparator module that is adapted to compare the output of the reference voltage electronic circuit with the output of the high precision voltage source. The comparator module is further adapted to tune the tunable transformation module of the reference voltage electronic circuit. Tuning of the transformation module is typically performed by modifying a first and/or second resistor of a feedback loop making use of an operational amplifier. Typically, the first and second resistors are implemented as a circuit of a set of resistors that can be selectively connected or disconnected to the first and/or second resistors by means of CMOS implemented switches.

In still another aspect, the invention provides a battery powered portable electronic device that has a voltage regulator that makes use of a reference voltage electronic circuit of the present invention.

In still another aspect, the invention provides a cellular phone that comprises a reference voltage electronic circuit according to the present invention.

In the following it is to be noted that any reference signs in the claims are not to be construed as limiting the scope of the present invention.

Figure 2:
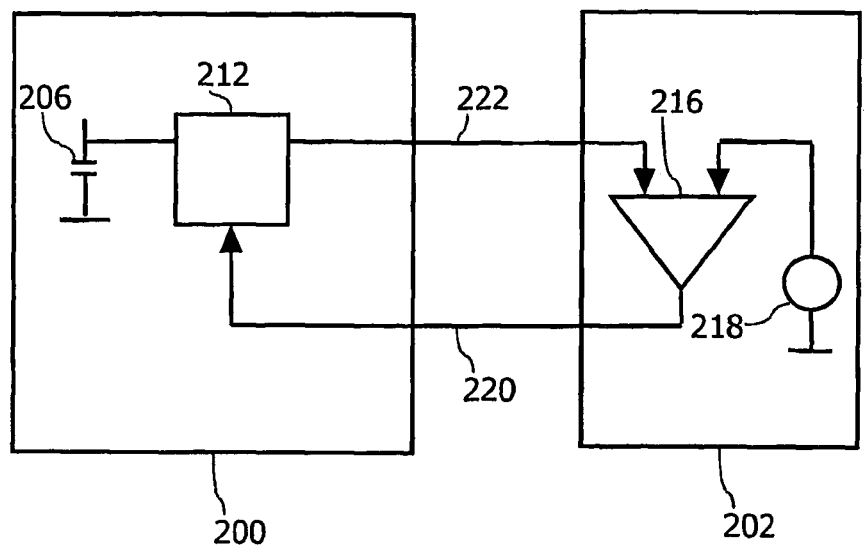
Figure 4:
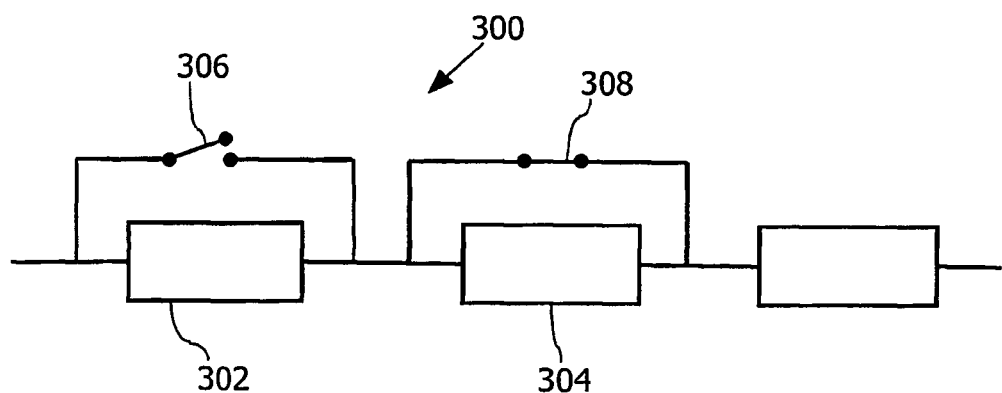
Figure 3:
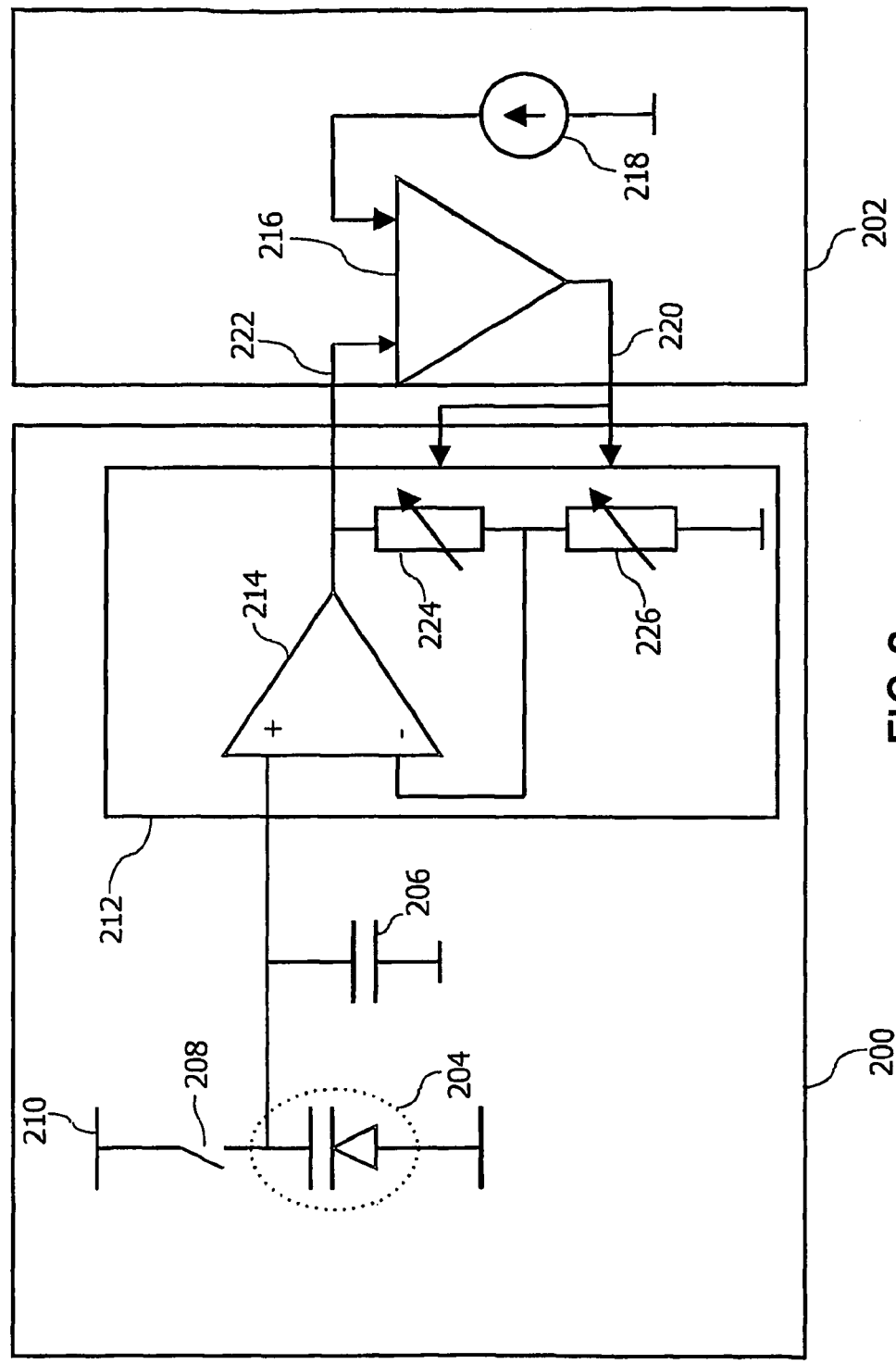

In the following preferred embodiments of the invention are described by making reference to the drawings in which:

FIG. 1 shows a schematic illustration of a prior art implementation of a reference voltage electronic circuit making use of an EEPROM module, FIG. 2 shows a block diagram of the inventive reference voltage circuit, FIG. 3 shows a schematic circuit diagram of the reference voltage electronic circuit, FIG. 4 shows a circuit diagram of a set of resistors forming the first and/or second resistors of the tunable transformation module.

FIG. 2 shows a schematic block diagram of the reference voltage electronic circuit 200 and the external calibration module 202. The reference voltage electronic circuit 200 has a capacitive charge trapping module that is illustrated as an equivalent capacitor 206. Typically, this capacitive module can be implemented by means of a read-only memory (ROM), such as e.g. an EPROM. Further, the reference voltage circuit 200 has a tunable transformation module 212 whose input is connected to the equivalent capacitor 206 and whose output is connected to the output port 222 of the reference voltage circuit 200.

The calibration module 202 has a comparator module 216 and a high precision voltage source 218. The comparator 216 is coupled to the output 222 of the reference voltage circuit 200 and serves to compare the output voltage of the tunable transformation module 212 with the voltage provided by the high precision voltage source 218: In case of a mismatch between the output reference voltage and the high precision voltage, the comparator 216 generates a control signal that is provided to the tunable transformation module 212. In this way tunable transformation module 212 and the comparator module 216 form a control loop for minimizing the mismatch between output reference voltage and high precision voltage provided by the high precision voltage source 218.

If the mismatch between output reference voltage and high precision voltage has been eliminated, the calibration module 202 and the reference voltage electronic circuit 200 are disconnected. The configuration of the tunable transformation module 212 as well as the charge trapped by means of the capacitive storage module 206 remain unchanged if the calibration module 202 is disconnected. In this configuration determined by the calibration procedure, the reference voltage circuit 200 provides a stable and accurate reference voltage at output port 222 by simultaneously requiring a very low current, e.g. even below 1 μA.

In contract to the prior art implementation illustrated by FIG. 1, the charge storing device 206 does not have to be implemented as a reconfigurable storage device, such as an EEPROM. Hence, in the present invention, the charge trapping device can be effectively realized by means of a one-time programmable EPROM module, because calibration of the reference voltage circuit 200 only requires a modification of the tunable transformation module 212. The tuning of the tunable transformation module 212 is governed by means of the calibration module and its comparator module 216. Hence, the output of the comparator module 216 is coupled to the tunable transformation module 212 as a feedback signal by means of the conductor 220.

By implementing the charge trapping device by means of a non-modifiable capacitive module 206, the entire reference voltage circuit 200 can be manufactured in a cost efficient way compared to an implementation making use of reconfigurable EEPROM based module. Moreover, by tuning of the transformation module 212, the charge trapping module does by no means have to be classified or modeled. Consequently, manufacturing and developing time of the reference voltage circuit 200 can be remarkably decreased compared to an implementation as illustrated in FIG. 1.

FIG. 3 schematically illustrates a circuit diagram of the reference voltage 200 and the external calibration module 202. Here, the read-only memory of the reference voltage circuit is implemented by means of an EPROM module 204 that can be connected to a voltage source 210 via the switch 208. The equivalent capacitor 206 only represents the capacitive functionality of the EEPROM module 204. The floating gate of the EPROM module 204 is connected to the input of the tunable transformation module 212 that provides the output reference voltage at output terminal 222. Similar as already illustrated in FIG. 2, output of the reference voltage electronic circuit 200 is coupled to the external calibration module 202 that has a high precision reference voltage source 218 and a comparator 216.

The tunable transformation module 212 is further implemented as a feedback loop that has an operational amplifier 214 and a first and a second resistor 224 and 226, respectively. Here, both resistors 224, 226 are illustrated as tunable resistors that can be tuned by the calibration module 202. Hence, the output of the comparator module 216 is coupled to resistor 224 as well as to resistor 226.

Operational amplifier 214, resistors 224, 226 as well as comparator 216 form a feedback loop that tends to adjust the output voltage of the operational amplifier 214 to the same voltage as provided by the high precision reference voltage source 218. In particular, the arrangement of operational amplifier 214, resistor 224 and resistor 226 represents a negative feedback configuration, where the operational amplifier tends to generate an output voltage in such a way that its input voltages become equal. In this way, by modifying both or any one of both resistors 224, 226, the output voltage of operational amplifier 214 can be sufficiently tuned.

In case of a large gain factor of the operational amplifier 214, the output voltage at output port 222 approximates to:

$$V_{ref} = V_0 \left(1 + \frac{R_1}{R_2}\right),$$

where $V_0$ corresponds to the voltage applied to the non-inverted input port of operation amplifier 214, $V_{ref}$ represents the output reference voltage and $R_1$, $R_2$ correspond to the resistance of resistors 224 and 226, respectively.

The input voltage is governed by the charge that is trapped by means of the EPROM module 204. Since the module 204 is typically initialized by a one-shot programming, procedure, the digitally stored charge value may be of arbitrary size and hence the voltage $V_0$ at the non-inverted input port of the operational amplifier 214 may vary correspondingly. Now, in order to obtain a predefined reference voltage of $V_{ref}$ at least one of the resistors 224, 226 has to be appropriately trimmed.

In principle, this trimming can be performed by means of a laser or fuse blowing method or by implementing the tunable resistors 224, 226 by means of an arrangement of numerous unit resistors and switches.

When during the calibration procedure the output reference voltage at output terminal 222 is larger than the high precision reference voltage, then the resistance 224 is decreased, e.g. by short circuiting a portion of this resistance through an electrical switch. In the other case, if the output reference voltage is too low, resistor 224 might be increased or alternatively, resistance of resistor 226 may be decreased in a similar way. Depending on the concrete implementation of the two resistors 224 and 226 tuning of the transformation module 212 can be performed by increasing or decreasing of any of the resistors 224, 226 or by a combined modification of their resistance.

Typically, the calibration procedure is iteratively repeated until resistor 224 or resistor 226 cannot be furthermore tuned or if the mismatch between output reference voltage and high precision external voltage is within the tolerance margin of the reference voltage circuit 200. When implementing the resistors 224 and 226 as resistance ladders comprising numerous unit resistors and switches based on CMOS technology, the accuracy of the output reference voltage at output port 222 is mainly governed by the accuracy of the resistors 224, 226, which in turn depends on the accuracy of their basic resistors and on the number of basic resistors required for implementation of resistors 224 and 226. For instance, for an output reference voltage of 1.25V an accuracy of 0.1% with a temperature drift of 10 ppm per degree and a current consumption of 500 nA can principally be realized with the present invention.

FIG. 4 schematically shows an implementation of the tunable resistors 224, 226 by means of a resistance ladder 300 having a resistor 302 and a resistor 304 that are coupled in series. Parallel to each resistor 302, 304 the resistance ladder 300 has a switch 306, 308. Each one of the switches 306, 308 serves to short circuit the corresponding resistor 302, 304. Typically, switches 306, 308 are implemented as CMOS, PMOS or NMOS based switches. Resistance ladder 300 is only fragmentary illustrated, it may contain a large number of resistors and switches, exceeding 100 or even 1000 separate unit resistors 302, 304 and switches 306, 308. Generally, by implementing a large number of resistors 302, 304, the matching precision of the overall resistance value of the resistance ladder 300 increases with $1/\sqrt{N}$, with N as the total number of resistors 302, 304. In this way even though each resistor 302, 304 may feature an appreciable variance of its absolute resistance, a very precise relative matching of the resistors 224 and 226 can be realized.

The overall resistance of the resistance ladder 300 is finally given by the switch configuration of the switches 306, 308. Preferably, this switch configuration is stored in form of a set of driving signal for the gates of the switches. These driving signal can be effectively stored by means of an EPROM allowing for non-volatile storage of the configuration of the tunable transformation module. In this way it is effectively guaranteed that the arbitrary charge stored by means of the EPROM module 204 as well as the configuration of the transformation module remains unchanged when the calibration module is disconnected from the reference voltage electronic circuit.

Since the inventive reference voltage circuit does not require reconfigurable and thus expensive EEPROM modules, it is suitable for almost any type of portable battery driven electronic device, such as mobile telephones and mobile multimedia appliances, such as CD players, personal digital assistants, video games and cameras. Further, the present reference voltage circuit may be implemented into other portable electronic devices where standby time is an important performance parameter, such as with portable navigation devices making use of e.g. the global positioning satellite (GPS) system.

LIST OF REFERENCE NUMERALS

| | |
|---|---|
| 100 | reference voltage circuit |
| 102 | calibration module |
| 104 | EEPROM module |
| 106 | equivalent capacitor |
| 108 | switch |
| 110 | switch |
| 112 | adjustable current source |
| 114 | buffer |
| 116 | comparator |
| 118 | high precision voltage source |
| 120 | conductor |
| 122 | conductor |
| 200 | reference voltage circuit |
| 202 | calibration module |
| 204 | EPROM module |
| 206 | equivalent capacitor |
| 208 | switch |
| 210 | voltage source |
| 212 | tunable transformation module |
| 214 | operational amplifier |
| 216 | comparator |
| 218 | high precision voltage source |
| 220 | conductor |
| 222 | conductor |
| 224 | tunable resistor |
| 226 | tunable resistor |

The invention claimed is:

1. A reference voltage electronic circuit comprising:
a capacitive element having a floating gate for non-volatile and non-modifiable storage of a constant charge,
a tunable transformation module having an input being coupled to the capacitive element providing a constant voltage corresponding to the constant charge, the transformation module providing tunable transformation of the constant voltage to an output reference voltage,
a control loop for tuning the transformation module by means of an external calibration module making use of a high precision reference voltage source.

2. The reference voltage electronic circuit according to claim 1, wherein the tunable transformation module comprises an operational amplifier and at least first and second resistors forming a feedback loop, the resistance of the first and/or second resistors being tunable by means of the external calibration module.

3. The reference voltage electronic circuit according to claim 1, wherein the capacitive element comprising an erasable programmable read-only memory module.

4. The reference voltage electronic circuit according to claim 2, wherein each of the first and/or second resistors comprise a circuit of a set of resistors and a set of metal-oxide-semiconductor based switches, the resistance of the first and/or second resistor being determined by means of the configuration of the set of switches.

5. The reference voltage electronic circuit according to claim 4, wherein the resistances of the first and/or second resistors are determined by means of the calibration module and wherein the switch configuration is stored by means of a an EPROM module.

6. A method of calibrating a reference voltage electronic circuit comprising the steps of:
storing a constant charge by means of a capacitive element having a floating gate for non-volatile and non-modifiable storage of charges,
providing a constant voltage corresponding to the constant charge to an input of a tunable transformation module,
transforming the constant voltage to an output reference voltage by means of the tunable transformation module,
calibrating the reference voltage electronic circuit by tuning the transformation module in response to receive a control signal from an external calibration module making use of a high precision reference voltage source.

7. A calibration module for calibrating a reference voltage electronic circuit having a capacitive element with a floating gate for non-volatile and non-modifiable storage of a constant charge and having a tunable transformation module having an input being coupled to the capacitive element providing a constant voltage corresponding to the constant charge, the calibration module comprising:
a high precision reference voltage source,
a comparator module being adapted to compare the output of the reference voltage electronic circuit with the output of the high precision voltage source, the comparator module being adapted to tune the tunable transformation module of the reference voltage electronic circuit.

8. A battery powered portable electronic device having a voltage regulator making use of a reference voltage electronic circuit according to claim 1.

9. A cellular phone comprising a reference voltage electronic circuit according to claim 1.

* * * * *